US012100733B2

(12) United States Patent
Li et al.

(10) Patent No.: US 12,100,733 B2
(45) Date of Patent: Sep. 24, 2024

(54) SEMICONDUCTOR DEVICE WITH LEAKAGE CURRENT GUIDE PATH AND METHOD FOR FABRICATING THE SAME

(71) Applicant: NANYA TECHNOLOGY CORPORATION, New Taipei (TW)

(72) Inventors: Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 500 days.

(21) Appl. No.: 17/465,309

(22) Filed: Sep. 2, 2021

(65) Prior Publication Data

US 2023/0069497 A1 Mar. 2, 2023

(51) Int. Cl.
*H01L 29/06* (2006.01)
*H01L 29/08* (2006.01)

(52) U.S. Cl.
CPC ...... *H01L 29/0607* (2013.01); *H01L 29/0847* (2013.01)

(58) Field of Classification Search
None
See application file for complete search history.

(56) References Cited

U.S. PATENT DOCUMENTS

| | | | | |
|---|---|---|---|---|
| 2003/0168677 A1* | 9/2003 | Hsu | ......................... | H10B 12/20 |
| | | | | 257/E21.654 |
| 2006/0261408 A1* | 11/2006 | Khemka | .............. | H01L 29/8611 |
| | | | | 257/E29.328 |
| 2008/0073725 A1* | 3/2008 | Morris | .................. | H01L 21/761 |
| | | | | 257/E21.544 |
| 2022/0336682 A1* | 10/2022 | Yuki | ....................... | H01L 29/87 |

* cited by examiner

*Primary Examiner* — Cory W Eskridge
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate; a bottom conductive region positioned in the substrate; a first gate structure positioned on the substrate; a first drain region positioned in the substrate and adjacent to one sidewall of the first gate structure; and a first extended conductive region positioned in the substrate, under the first drain region, contacting a bottom surface of the first drain region, and distant from the bottom conductive region. A top surface of the first drain region and a top surface of the substrate are substantially coplanar. The bottom conductive region and the first extended conductive region include the same electrical type. The first drain region and the first extended conductive region include different electrical types.

20 Claims, 17 Drawing Sheets

SEMICONDUCTOR DEVICE WITH LEAKAGE CURRENT GUIDE PATH AND METHOD FOR FABRICATING THE SAME

TECHNICAL FIELD

The present disclosure relates to a semiconductor device and a method for fabricating the semiconductor device, and more particularly, to a semiconductor device with leakage current guide path and a method for fabricating the semiconductor device with leakage current guide path.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a bottom conductive region positioned in the substrate; a first gate structure positioned on the substrate; a first drain region positioned in the substrate and adjacent to one sidewall of the first gate structure; and a first extended conductive region positioned in the substrate, under the first drain region, contacting a bottom surface of the first drain region, and distant from the bottom conductive region. A top surface of the first drain region and a top surface of the substrate are substantially coplanar. The bottom conductive region and the first extended conductive region include the same electrical type. The first drain region and the first extended conductive region include different electrical types.

In some embodiments, the semiconductor device includes a first source region positioned adjacent to another sidewall of the first gate structure. A top surface of the first source region and the top surface of the substrate are substantially coplanar.

In some embodiments, the semiconductor device includes a baseline conductive region positioned in the substrate. A top surface of the baseline conductive region and the top surface of the substrate are substantially coplanar. The baseline conductive region and the bottom conductive region include the same electrical type.

In some embodiments, the semiconductor device includes an edge conductive region positioned in the substrate, on the bottom conductive region, under the baseline conductive region, and distant from the baseline conductive region. The bottom conductive region and the edge conductive region include the same electrical type.

In some embodiments, the semiconductor device includes a plurality of gate spacers positioned on the sidewalls of the first gate structure and on the substrate. The plurality of gate spacers include silicon oxide, silicon nitride, silicon oxynitride, or silicon oxide nitride.

In some embodiments, the semiconductor device includes a plurality of first lightly doped regions positioned in the substrate, respectively and correspondingly adjoining the first drain region and the first source region, and respectively and correspondingly under the plurality of gate spacers.

In some embodiments, the first gate structure includes a first gate dielectric layer positioned on the substrate and a first gate conductive layer positioned on the first gate dielectric layer.

In some embodiments, a bottom surface of the first extended conductive region is at a vertical level lower than a vertical level of a top surface of the edge conductive region.

In some embodiments, a bottom surface of the baseline conductive region and the bottom surface of the first drain region are substantially coplanar.

In some embodiments, a bottom surface of the baseline conductive region is at a vertical level lower than a vertical level of the bottom surface of the first drain region.

In some embodiments, a length of the first extended conductive region is greater than or equal to a length of first drain region in a top-view perspective.

In some embodiments, a length of the edge conductive region is greater than or equal to a length of the baseline conductive region.

In some embodiments, the substrate and the bottom conductive region include the same electrical type.

In some embodiments, the first drain region is configured to electrically couple to an external voltage source between about +0.0 volts and about +6.0 volts.

In some embodiments, the baseline conductive region is configured to electrically couple to an external voltage source between about +0.0 volts and about −2.0 volts.

In some embodiments, the semiconductor device includes a second gate structure, a second drain region, and a second extended conductive region. The second gate structure is positioned on the substrate, between the first gate structure and the baseline conductive region. The second drain region is positioned in the substrate, proximity to one sidewall of the second gate structure, and between the first source region and the baseline conductive region. The second extended conductive region is positioned in the substrate, under the second drain region, contacting a bottom surface of the second drain region, and distant from the bottom conductive region. A top surface of the second drain region and a top surface of the substrate are substantially coplanar. The bottom conductive region and the second extended conductive region include the same electrical type. The second drain region and the second extended conductive region include different electrical types.

In some embodiments, the semiconductor device includes an insulation layer positioned in the substrate and between the second drain region and the first source region. The insulation layer includes silicon oxide, silicon nitride, silicon nitride, silicon oxynitride, or silicon oxide nitride.

In some embodiments, a bottom surface of the insulation layer is at a vertical level higher than the vertical level of the bottom surface of the first extended conductive region.

Another aspect of the present disclosure provides a method for fabricating a semiconductor device including providing a substrate; forming a bottom conductive region in the substrate; forming a first extended conductive region in the substrate and above the bottom conductive region; forming a first gate structure on the substrate; and forming a first drain region in the substrate, proximity to one sidewall of the first gate structure, and on the first extended conductive region. A top surface of the first drain region and a top surface of the substrate are substantially coplanar. The bottom conductive region and the first extended conductive region include the same electrical type. The first drain region and the first extended conductive region include different electrical types.

In some embodiments, the method for fabricating the semiconductor device includes forming an edge conductive region in the substrate, on the bottom conductive region, and distal from the first extended conductive region.

Due to the design of the semiconductor device of the present disclosure, the bottom conductive region, the first extended conductive region, the second extended conductive region, and the edge conductive region may serve as guide paths for the leakage currents induced by the high voltage during the programming operation. Therefore, the performance and reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
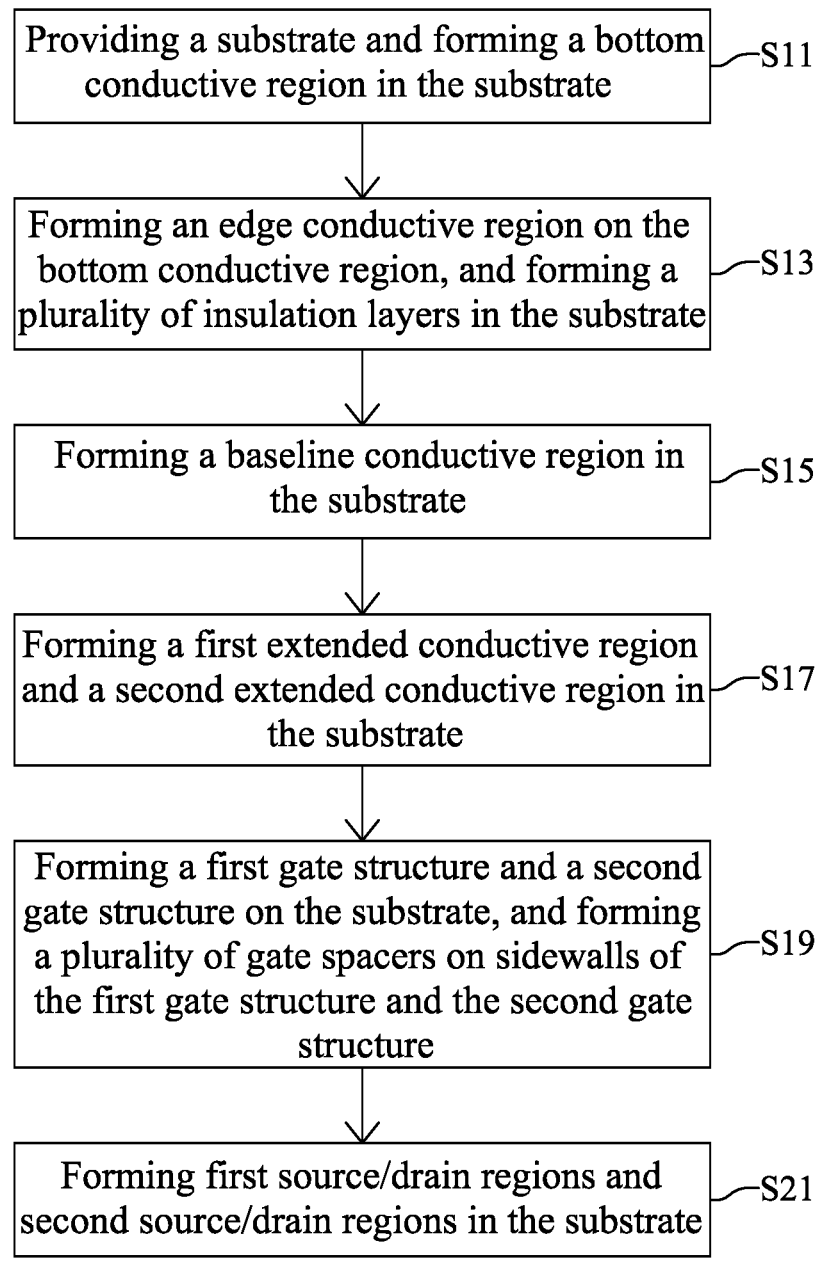
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of dimension Z, and below (or down) corresponds to the opposite direction of the arrow of dimension Z.

Figure 2:
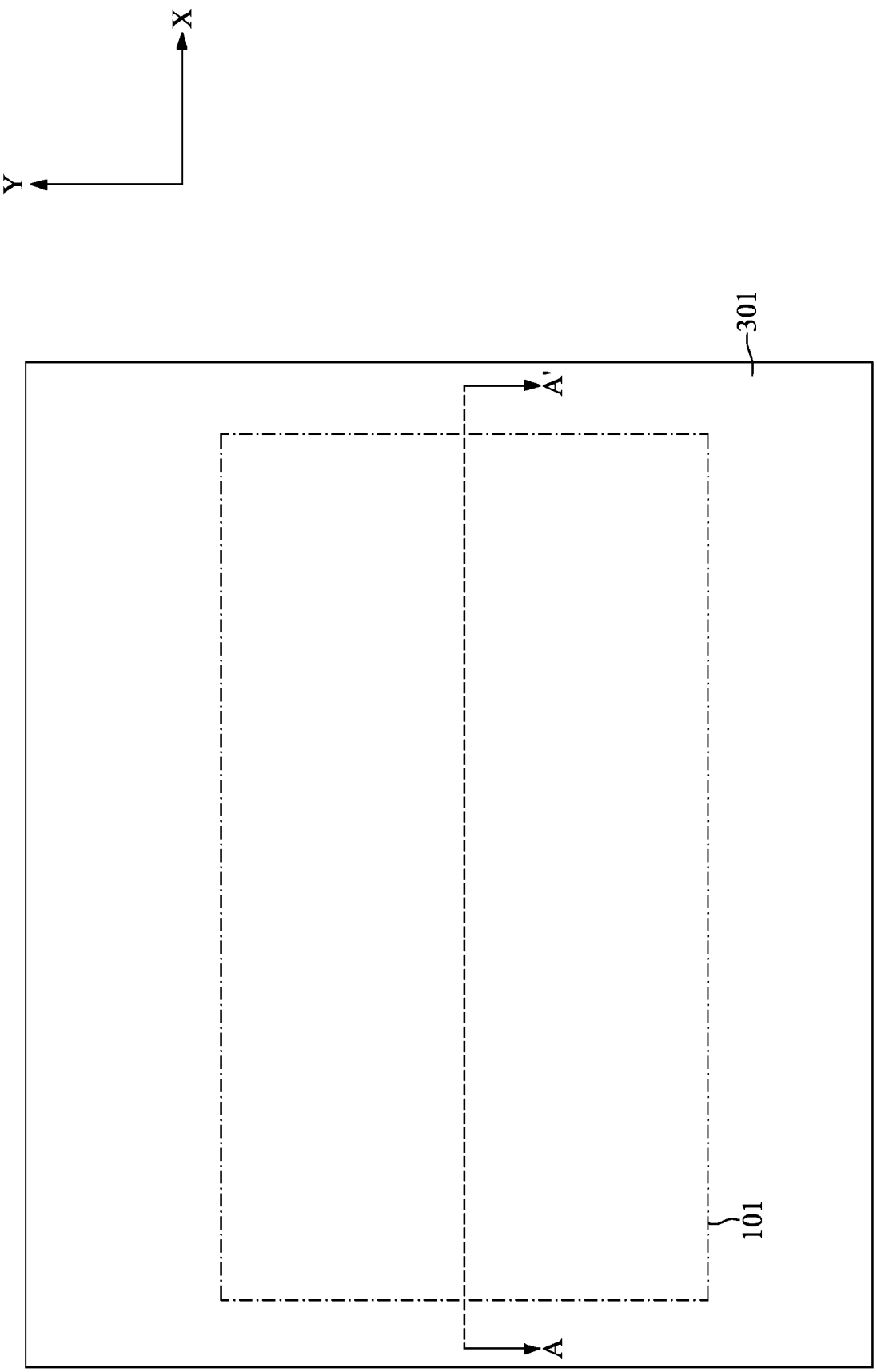
FIG. 2 illustrates, in a schematic top-view diagram, an intermediate semiconductor device in accordance with one embodiment of the present disclosure.
Figure 3:
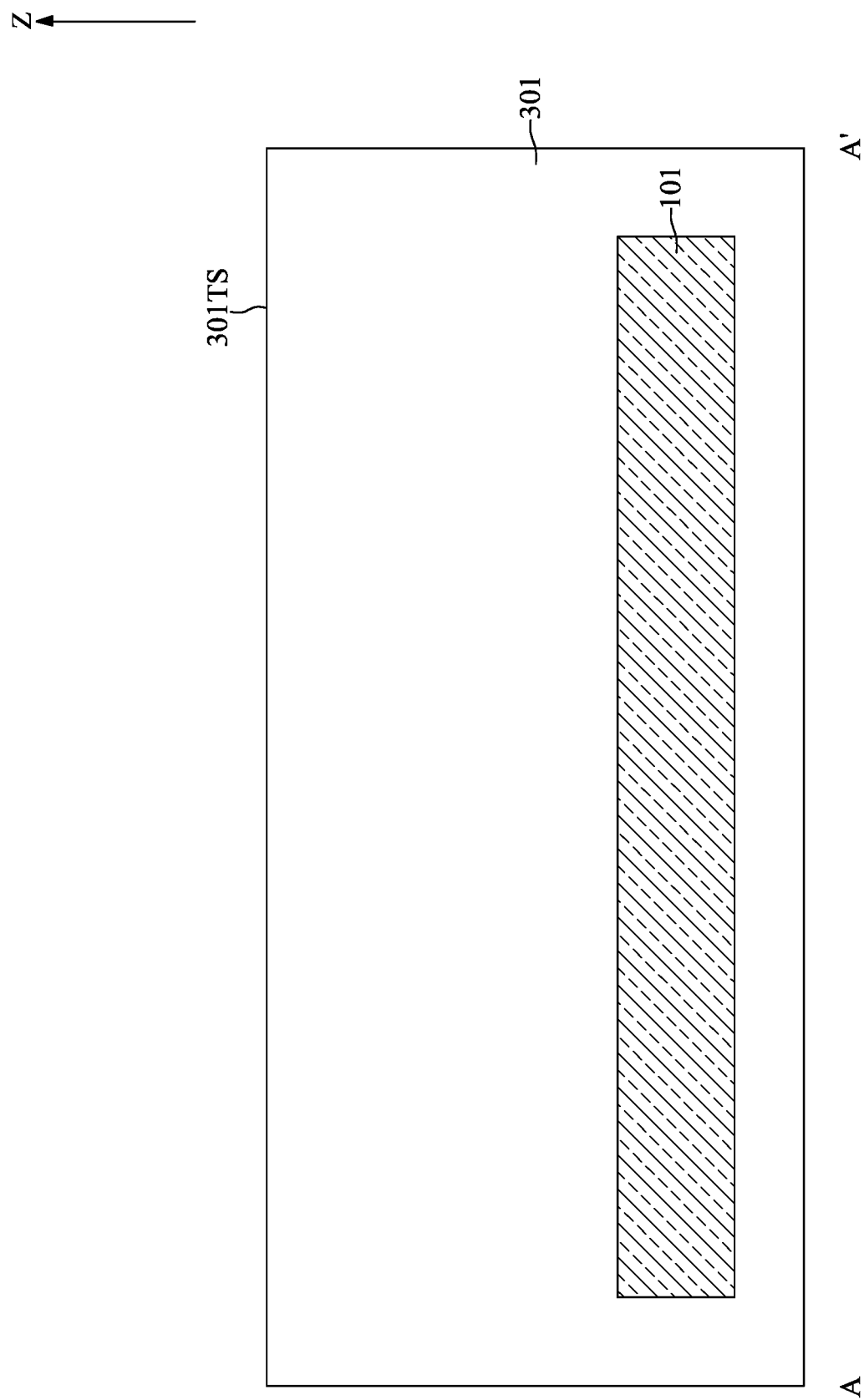
FIG. 3 is a schematic cross-sectional view diagram taken along a line A-A' in FIG. 2.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2.

With reference to FIGS. 1 to 3, at step S11, a substrate 301 may be provided and a bottom conductive region 101 may be formed in the substrate 301.

With reference to FIGS. 2 and 3, the substrate 301 may include a silicon-containing material. Illustrative examples of silicon-containing materials suitable for the substrate 301 may include, but are not limited to, silicon, silicon germanium, carbon doped silicon germanium, silicon germanium carbide, carbon-doped silicon, silicon carbide, and multilayers thereof. Although silicon is the predominantly used semiconductor material in wafer fabrication, in some embodiments, alternative semiconductor materials can be employed as additional layers, such as, but not limited to, germanium, gallium arsenide, gallium nitride, silicon germanium, cadmium telluride, zinc selenide, germanium tin, etc.

In some embodiments, the substrate 301 may be doped by a p-type impurity implant process so as to have a first electrical type. The p-type impurity implant process may add impurities to an intrinsic semiconductor that creates deficiencies of valence electrons. In a silicon-containing substrate, examples of p-type dopants, i.e., impurities include but are not limited to boron, aluminum, gallium, or indium.

It should be noted that the term "electrical type" denotes a dopant region being p-type or n-type.

With reference to FIGS. 2 and 3, the bottom conductive region 101 may be formed in the substrate 301. In some embodiments, the bottom conductive region 101 may be formed by an impurity implant process, for example, a p-type impurity implant process using p-type dopants such as boron, aluminum, gallium, or indium. In some embodiments, the bottom conductive region 101 may have the first electrical type which is the same as the electrical type of the substrate 301.

In some embodiments, the bottom conductive region 101 and the substrate 301 may be doped with the same dopant. In some embodiments, the bottom conductive region 101 and the substrate 301 may be doped with different dopants. In some embodiments, the dopant concentration of the bottom conductive region 101 may be less than the dopant concentration of the substrate 301. In some embodiments, the dopant concentration of the bottom conductive region 101 may be greater than the dopant concentration of the substrate 301.

Figure 4:
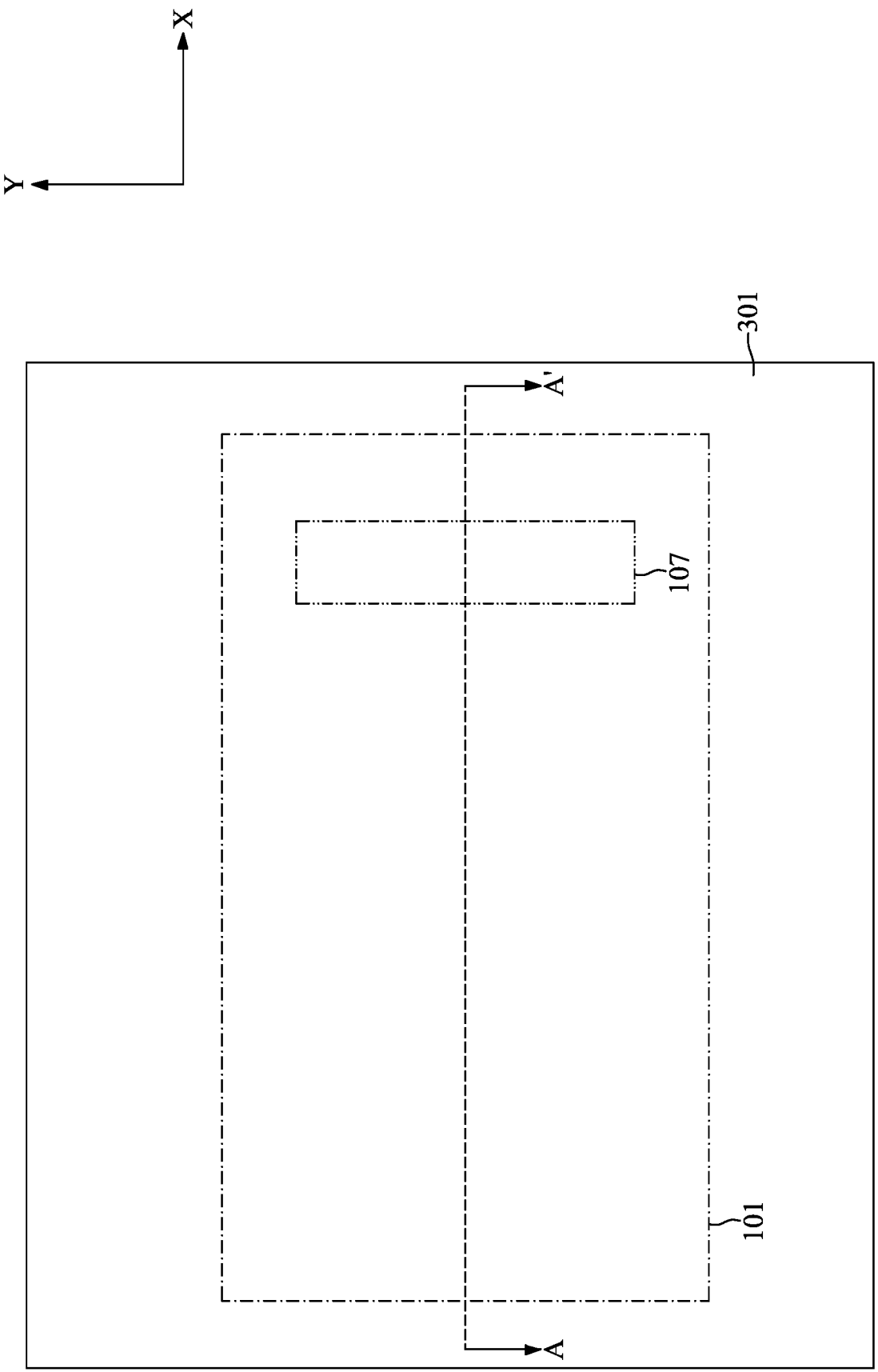
FIG. 4 illustrates, in a schematic top-view diagram, an intermediate semiconductor device in accordance with one embodiment of the present disclosure.
Figure 5:
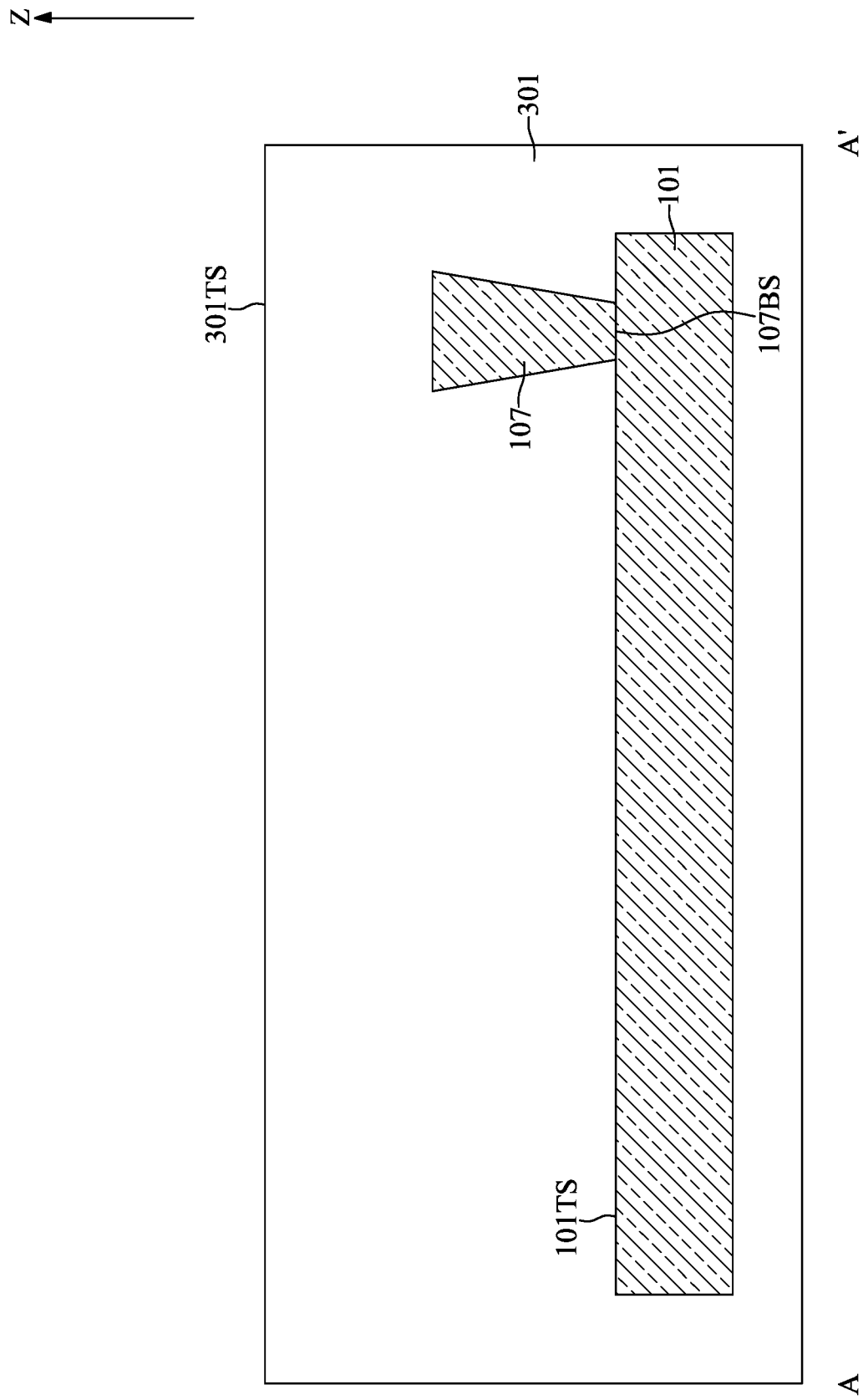
FIGS. 5 and 6 are schematic cross-sectional view diagrams taken along a line A-A' in FIG. 4 illustrating part of the flow for fabricating the semiconductor device in accordance with one embodiment of the present disclosure.
Figure 6:
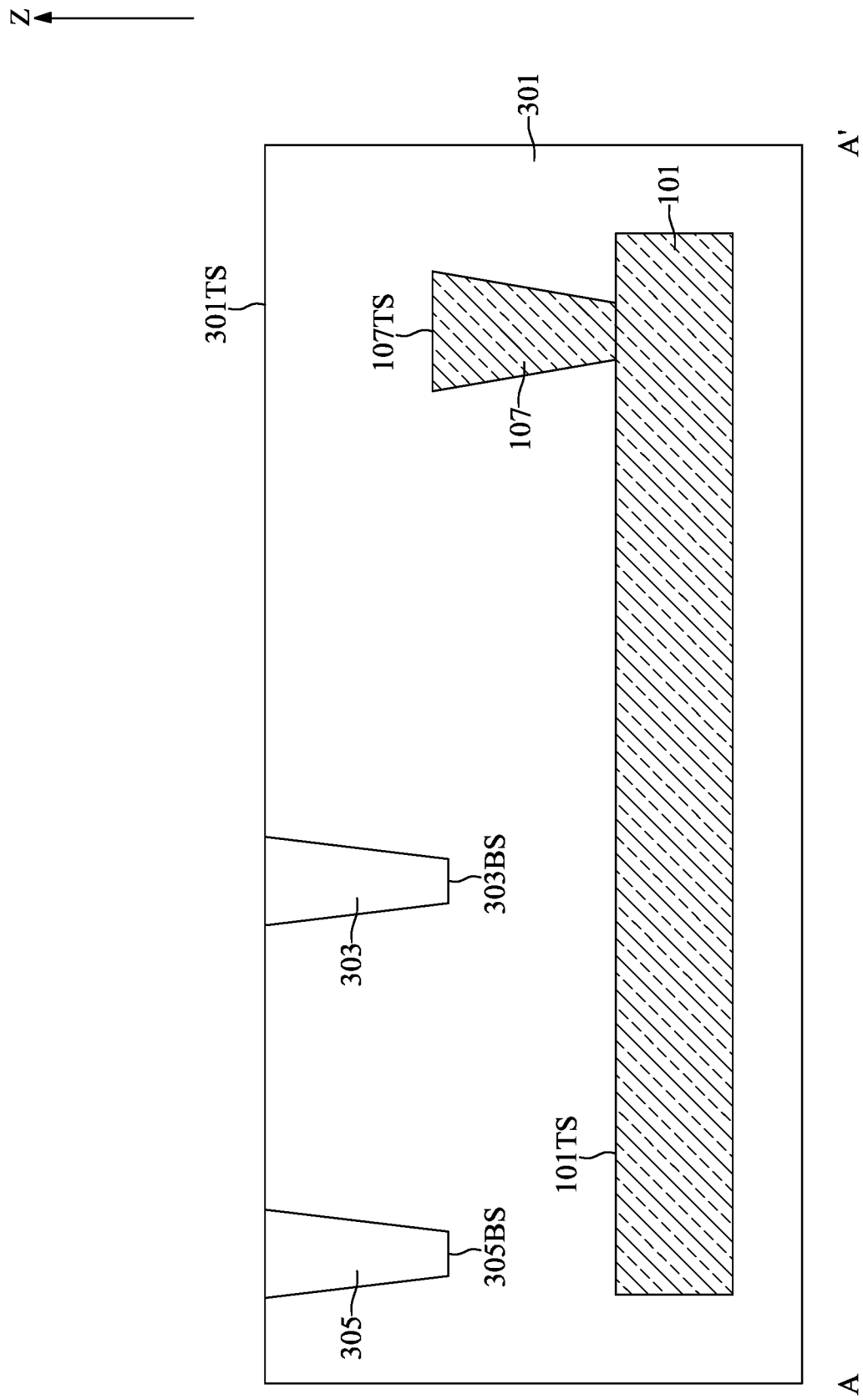

FIG. 4 illustrates, in a schematic top-view diagram, an intermediate semiconductor device in accordance with one embodiment of the present disclosure. FIGS. 5 and 6 are schematic cross-sectional view diagrams taken along a line A-A' in FIG. 4 illustrating part of the flow for fabricating the semiconductor device 1A in accordance with one embodiment of the present disclosure.

With reference to FIG. 1 and FIGS. 4 to 6, at step S13, an edge conductive region 107 may be formed on the bottom conductive region 101, and a plurality of insulation layers 303, 305 may be formed in the substrate 301.

With reference to FIGS. 4 and 5, a mask layer (not shown for clarity) may be formed on the substrate 301. The mask layer may have the pattern of the edge conductive region 107. In some embodiments, the mask layer may be a photoresist layer. In some embodiments, the mask layer may be a hard mask layer formed of silicon oxide, silicon nitride, silicon oxynitride, silicon nitride oxide, or other applicable materials. An impurity implant process using the mask layer as a pattern guide may be performed to form the edge conductive region 107. The impurity implant process may be, for example, a p-type impurity implant process using p-type dopants such as boron, aluminum, gallium, or indium. After the formation of the edge conductive region 107, the mask layer may be removed.

In a cross-sectional perspective, the edge conductive region 107 may be formed in the substrate 301 and on the top surface 101TS of the bottom conductive region 101. The bottom surface 107BS of the edge conductive region 107 may directly contact the top surface 101TS of the bottom conductive region 101. In some embodiments, the sidewalls of the edge conductive region 107 may be tapered. In a top-view perspective, in some embodiments, the area of the edge conductive region 107 may be less than the area of the bottom conductive region 101. For example, the area of the edge conductive region 107 may be less than the area of the bottom conductive region 101 between about 5% and 20%. In some embodiments, the area of the edge conductive region 107 and the area of the bottom conductive region 101 may be substantially the same.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

In some embodiments, the edge conductive region 107 may have the first electrical type which is the same as the electrical type of the bottom conductive region 101. In some embodiments, the edge conductive region 107 and the bottom conductive region 101 may be doped with the same dopant. In some embodiments, the edge conductive region 107 and the bottom conductive region 101 may be doped with different dopants.

In some embodiments, the dopant concentration of the edge conductive region 107 may be less than the dopant concentration of the substrate 301. In some embodiments, the dopant concentration of the edge conductive region 107 may be greater than the dopant concentration of the substrate 301.

In some embodiments, the dopant concentration of the edge conductive region 107 and the dopant concentration of the bottom conductive region 101 may be substantially the same. In some embodiments, the dopant concentration of the edge conductive region 107 may be greater than the dopant concentration of the bottom conductive region 101. In some embodiments, the dopant concentration of the edge conductive region 107 may be less than the dopant concentration of the bottom conductive region 101.

With reference to FIG. 6, a series of deposition processes may be performed to deposit a pad oxide layer (not shown for clarity) and a pad nitride layer (not shown for clarity) on the substrate 301. A photolithography process may be performed to define the pattern of the plurality of insulation layers 303, 305. After the photolithography process, an etch process, such as an anisotropic dry etch process, may be performed to form trenches penetrating along the pad oxide layer, the pad nitride layer, and the substrate 301. An insulating material may be deposited into the trenches, and a planarization process, such as chemical mechanical polishing, may be subsequently performed to remove excess filling material until the substrate 301 is exposed so as to obtain the plurality of insulation layers 303, 305. The insulating material may be, for example, silicon oxide, silicon nitride, silicon oxynitride, silicon nitride oxide, the like, or a combination thereof. In some embodiments, the plurality of insulation layers 303, 305 may define active regions in the substrate 301.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 6, the top surfaces of the plurality of insulation layers 303, 305 may be substantially coplanar with the top surface 301TS of the substrate 301. In some embodiments, the plurality of insulation layers 303, 305 may be formed directly above the bottom conductive region 101. In some embodiments, the plurality of insulation layers 303, 305 may be horizontally distant from the edge conductive region 107.

In some embodiments, the bottom surfaces 303BS, 305BS of the plurality of insulation layers 303, 305 and the top surface 107TS of the edge conductive region 107 may be at a substantially same vertical level. In some embodiments, the bottom surfaces 303BS, 305BS of the plurality of insulation layers 303, 305 may be at a vertical level lower than the vertical level of the top surface 107TS of the edge conductive region 107. In some embodiments, the bottom surfaces 303BS, 305BS of the plurality of insulation layers 303, 305 may be at a vertical level higher than the vertical level of the top surface 107TS of the edge conductive region 107.

Figure 7:
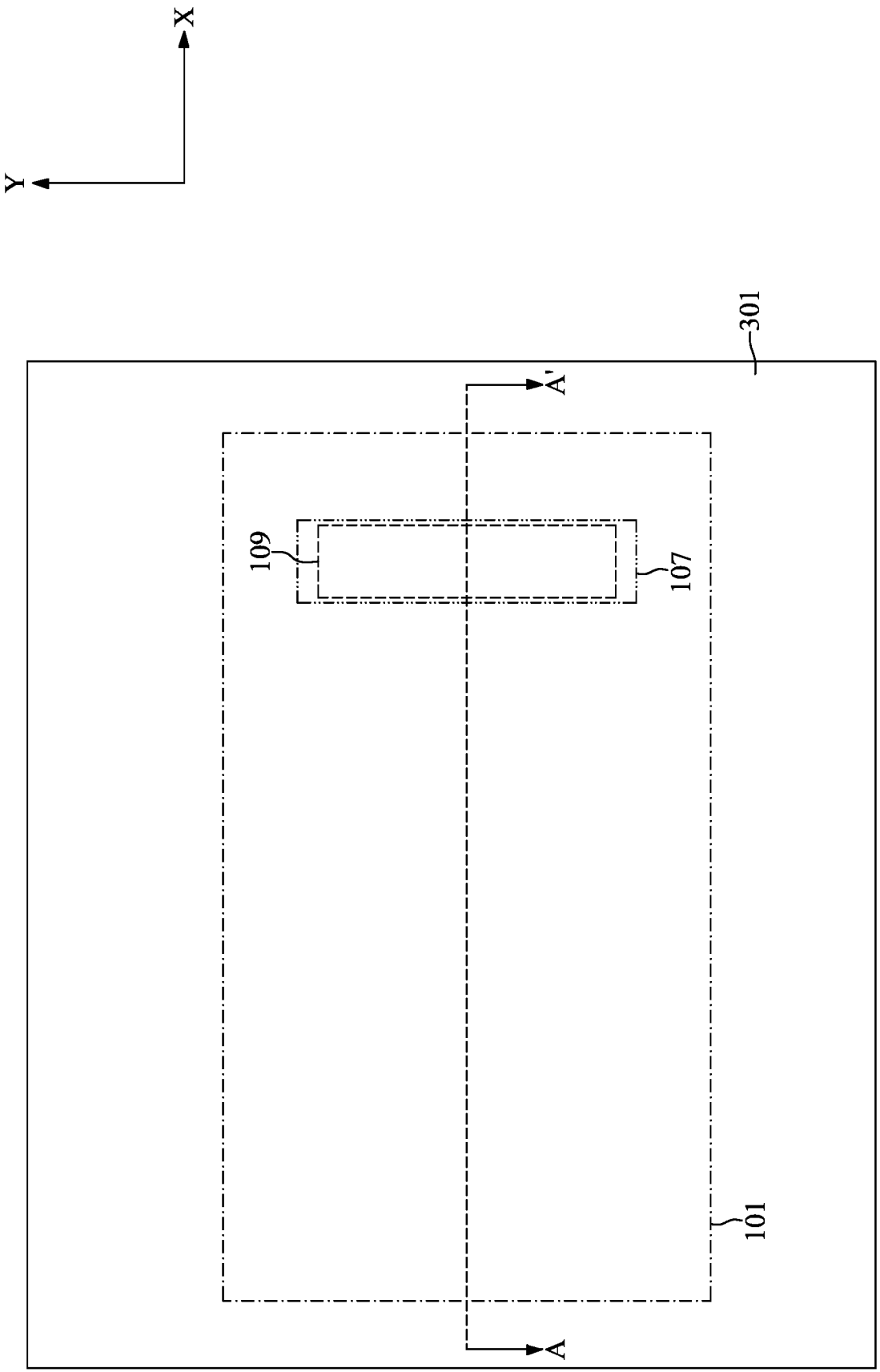
FIG. 7 illustrates, in a schematic top-view diagram, an intermediate semiconductor device in accordance with one embodiment of the present disclosure.
Figure 8:
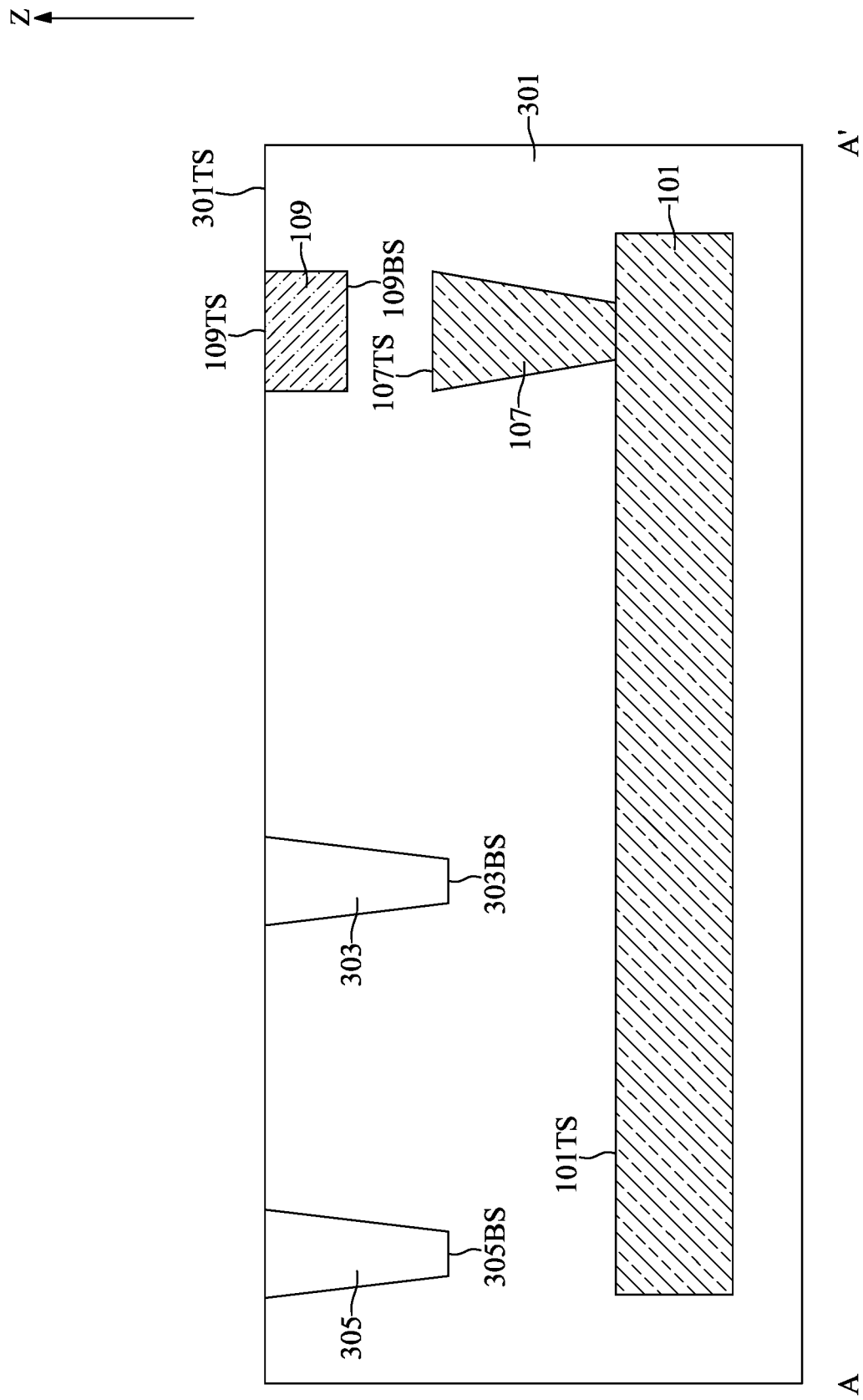
FIG. 8 is a schematic cross-sectional view diagram taken along a line A-A' in FIG. 8.

FIG. 7 illustrates, in a schematic top-view diagram, an intermediate semiconductor device in accordance with one embodiment of the present disclosure. FIG. 8 is a schematic cross-sectional view diagram taken along a line A-A' in FIG. 8.

With reference to FIGS. 1, 7, and 8, at step S15, a baseline conductive region 109 may be formed in the substrate 301.

With reference to FIGS. 7 and 8, a mask layer (not shown for clarity) may be formed on the substrate 301. The mask layer may have the pattern of the baseline conductive region 109. In some embodiments, the mask layer may be a photoresist layer. In some embodiments, the mask layer may be a hard mask layer formed of silicon oxide, silicon nitride, silicon oxynitride, silicon nitride oxide, or other applicable materials. An impurity implant process using the mask layer as pattern guide may be performed to form the baseline conductive region 109. The impurity implant process may be, for example, a p-type impurity implant process using p-type dopants such as boron, aluminum, gallium, or indium. After the formation of the baseline conductive region 109, the mask layer may be removed.

In a cross-sectional perspective, the baseline conductive region 109 may be formed in the substrate 301. The top surface 109TS of the baseline conductive region 109 and the top surface 301TS of the substrate 301 may be substantially coplanar. In some embodiments, the bottom surface 109BS of the baseline conductive region 109 may be at a vertical level higher than the vertical level of the bottom surfaces 303BS, 305BS of the plurality of insulation layers 303, 305. In some embodiments, the edge conductive region 107 and the baseline conductive region 109 may be topographically aligned. In other words, the edge conductive region 107 and the baseline conductive region 109 may be overlapped in a top-view perspective.

It should be noted that, in the description of the present disclosure, an x-y-z coordinate system is assumed where x and y refer to dimensions within the plane parallel to the major surface of the structure and z refers a dimension perpendicular to the plane, two features are topographically aligned when those features have substantially the same x, y coordinates.

In some embodiments, in a top-view perspective, the area of the baseline conductive region 109 and the area of the edge conductive region 107 may be substantially the same. In some embodiments, the area of the baseline conductive region 109 may be slightly less than the area of the edge conductive region 107. For example, the area of the baseline conductive region 109 may be less than the area of the edge conductive region 107 between about 5% and 20%. In some embodiments, the length L1 of the edge conductive region 107 may be greater than the length L2 of the baseline conductive region 109. In some embodiments, the length L1 of the edge conductive region 107 and the length L2 of the baseline conductive region 109 may be substantially the same.

In some embodiments, the baseline conductive region 109 may have the first electrical type which is the same as the electrical type of the bottom conductive region 101, the electrical type of the edge conductive region 107, or the electrical type of the substrate 301. In some embodiments, the baseline conductive region 109 and the bottom conductive region 101 may be doped with the same dopant. In some embodiments, the baseline conductive region 109 and the bottom conductive region 101 may be doped with different dopants. In some embodiments, the baseline conductive region 109 and the edge conductive region 107 may be doped with the same dopant. In some embodiments, the baseline conductive region 109 and the edge conductive region 107 may be doped with different dopants.

In some embodiments, the dopant concentration of the baseline conductive region 109 may be greater than the dopant concentration of the substrate 301. In some embodiments, the dopant concentration of the baseline conductive region 109 may be greater than the dopant concentration of the bottom conductive region 101. In some embodiments, the dopant concentration of the baseline conductive region 109 may be greater than the dopant concentration of the edge conductive region 107.

In some embodiments, the baseline conductive region 109 may be configured to electrically couple to an external voltage source. The external voltage source may be ground or may be set to between about 0.0 volts and about −2.0 volts.

Figure 9:
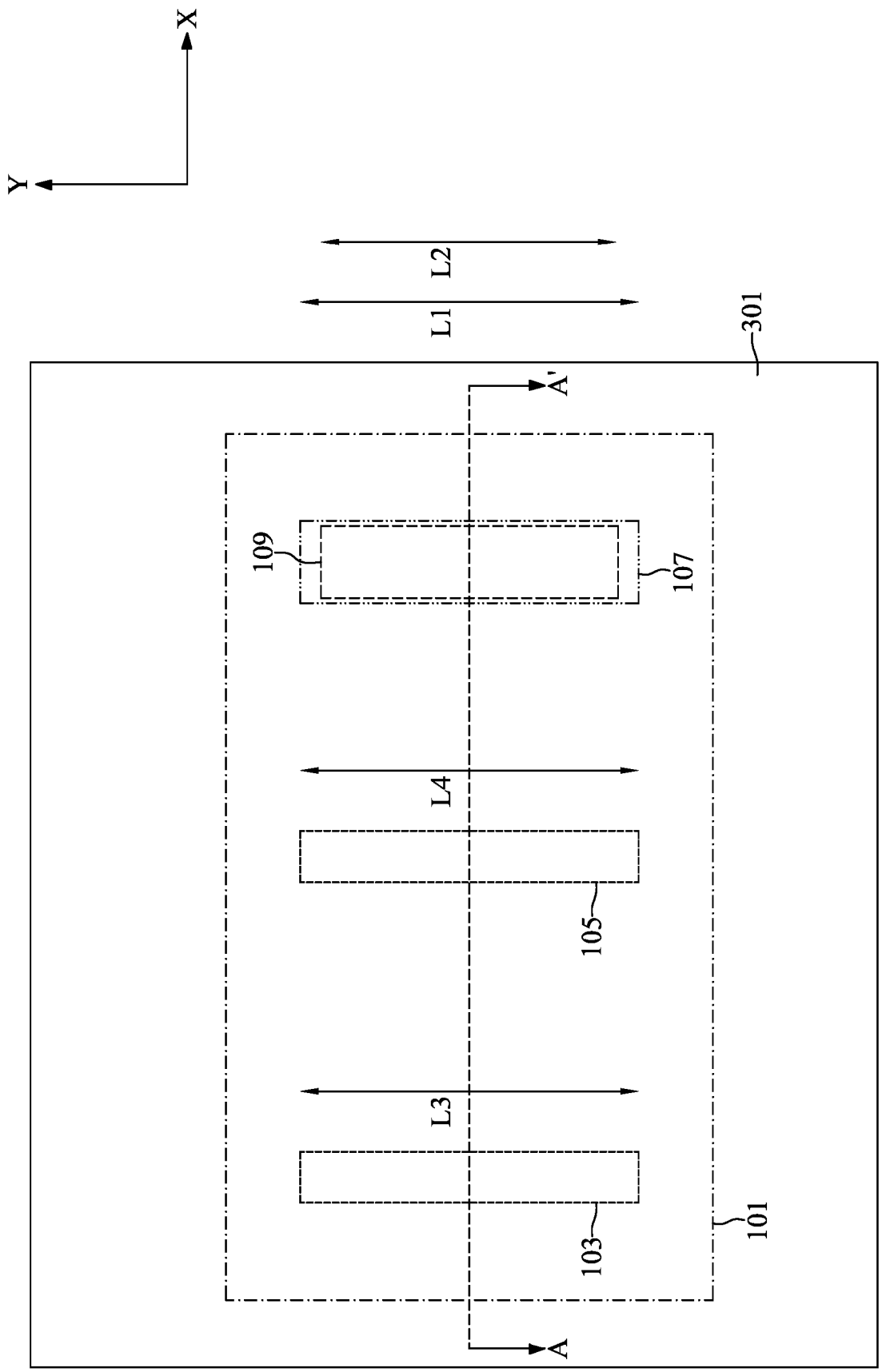
FIG. 9 illustrates, in a schematic top-view diagram, an intermediate semiconductor device in accordance with one embodiment of the present disclosure.

FIG. 9 illustrates, in a schematic top-view diagram, an intermediate semiconductor device in accordance with one embodiment of the present disclosure. FIGS. 10 to 15 are schematic cross-sectional view diagrams taken along a line A-A' in FIG. 9 illustrating part of the flow for fabricating the semiconductor device 1A in accordance with one embodiment of the present disclosure.

Figure 10:
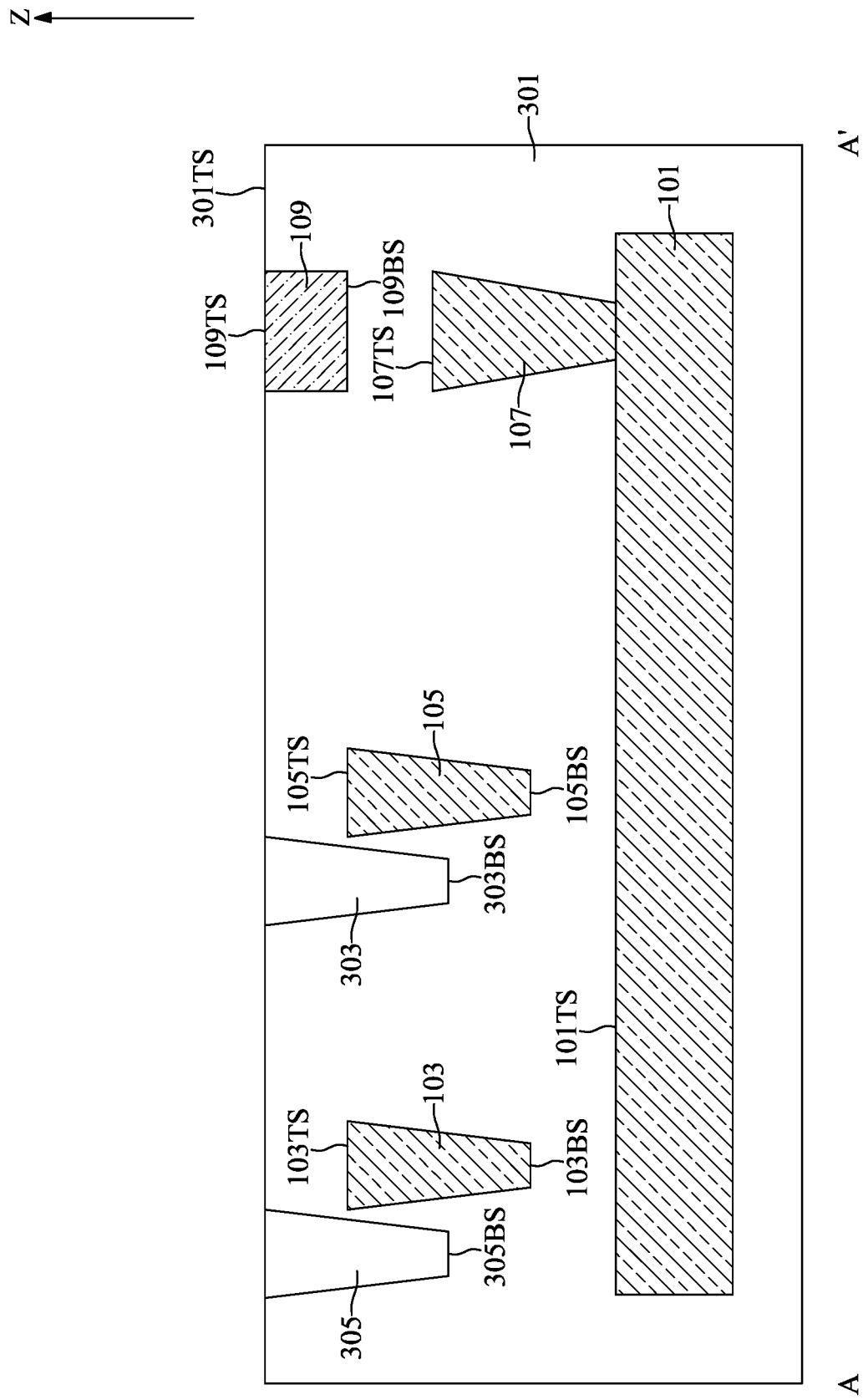
FIGS. 10 to 15 are schematic cross-sectional view diagrams taken along a line A-A' in FIG. 9 illustrating part of the flow for fabricating the semiconductor device in accordance with one embodiment of the present disclosure.

With reference to FIGS. 1, 9, and 10, at step S17, a first extended conductive region 103 and a second extended conductive region 105 may be formed in the substrate 301.

With reference to FIGS. 9 and 10, a mask layer (not shown for clarity) may be formed on the substrate 301. The mask layer may have the pattern of the first extended conductive region 103 and the second extended conductive region 105. In some embodiments, the mask layer may be a photoresist layer. In some embodiments, the mask layer may be a hard mask layer formed of silicon oxide, silicon nitride, silicon oxynitride, silicon nitride oxide, or other applicable materials. An impurity implant process using the mask layer as pattern guide may be performed to form the first extended conductive region 103 and the second extended conductive region 105. The impurity implant process may be, for example, a p-type impurity implant process using p-type dopants such as boron, aluminum, gallium, or indium. After the formation of the first extended conductive region 103 and the second extended conductive region 105, the mask layer may be removed.

In some embodiments, the first extended conductive region 103 and the second extended conductive region 105 may have the first electrical type which is the same as the electrical type of the bottom conductive region 101, the electrical type of the edge conductive region 107, or the electrical type of the substrate 301.

In some embodiments, the first extended conductive region 103, the second extended conductive region 105, and the bottom conductive region 101 may be doped with the same dopant. In some embodiments, the first extended conductive region 103, the second extended conductive region 105, and the bottom conductive region 101 may be doped with different dopants. In some embodiments, the first extended conductive region 103, the second extended conductive region 105, and the edge conductive region 107 may be doped with the same dopant. In some embodiments, the first extended conductive region 103, the second extended conductive region 105, and the edge conductive region 107 may be doped with different dopants.

In some embodiments, the dopant concentration of the first extended conductive region 103 and the second extended conductive region 105 may be greater than the dopant concentration of the substrate 301. In some embodiments, the dopant concentration of the first extended conductive region 103 and the second extended conductive region 105 may be substantially the same as the dopant concentration of the bottom conductive region 101. In some embodiments, the dopant concentration of the first extended conductive region 103 and the second extended conductive region 105 may be substantially the same as the dopant concentration of the edge conductive region 107.

In a cross-sectional perspective, the first extended conductive region 103 and the second extended conductive region 105 may be formed in the substrate 301. The first extended conductive region 103 may be formed next to the insulation layer 305 and between the plurality of insulation layers 303, 305. The second extended conductive region 105 may be formed next to the insulation layer 303 and between the insulation layer 303 and the baseline conductive region 109.

In some embodiments, the top surfaces 103TS, 105TS of the first extended conductive region 103 and the second extended conductive region 105 may be at a vertical level lower than the bottom surface 109BS of the baseline conductive region 109. In some embodiments, the top surfaces 103TS, 105TS of the first extended conductive region 103 and the second extended conductive region 105 may be at a vertical level higher than the bottom surface 109BS of the baseline conductive region 109. In some embodiments, the bottom surface 109BS of the baseline conductive region 109 and the top surfaces 103TS, 105TS of the first extended conductive region 103 and the second extended conductive region 105 may be at a substantially same vertical level.

In some embodiments, the top surfaces 103TS, 105TS of the first extended conductive region 103 and the second extended conductive region 105 may be at a vertical level higher than the top surface 107TS of the edge conductive region 107. In some embodiments, the bottoms surfaces 103BS, 105BS of the first extended conductive region 103 and the second extended conductive region 105 may be at a vertical level lower than the top surface 107TS of the edge conductive region 107.

In some embodiments, the bottoms surfaces 103BS, 105BS of the first extended conductive region 103 and the second extended conductive region 105 may be at a vertical level higher than the top surface 101TS of the bottom conductive region 101. That is, there are gaps between the first extended conductive region 103 and the bottom conductive region 101, and between the second extended conductive region 105 and the bottom conductive region 101, respectively and correspondingly.

In some embodiments, in a top-view perspective, the area of the first extended conductive region 103 and the area of the second extended conductive region 105 may be substantially the same. In some embodiments, the area of the first extended conductive region 103 may be less than the area of the edge conductive region 107. The length L3 of the first extended conductive region 103 and the length L4 of the second extended conductive region 105 may be substantially the same. In some embodiments, the length L1 of the edge conductive region 107 and the length L3 of the first extended conductive region 103 may be substantially the same. In some embodiments, the length L2 of the baseline conductive region 109 and the length L3 of the first extended conductive region 103 may be substantially the same. In some embodiments, the length L3 of the first extended conductive region 103 may be less than the length L1 of the edge conductive region 107 or the length L2 of the baseline conductive region 109.

With reference to FIG. 1 and FIGS. 11 to 15, at step S19, a first gate structure 210 and a second gate structure 220 may be formed on the substrate 301, and a plurality of gate spacers 307 may be formed on sidewalls of the first gate structure 210 and the second gate structure 220.

Figure 11:
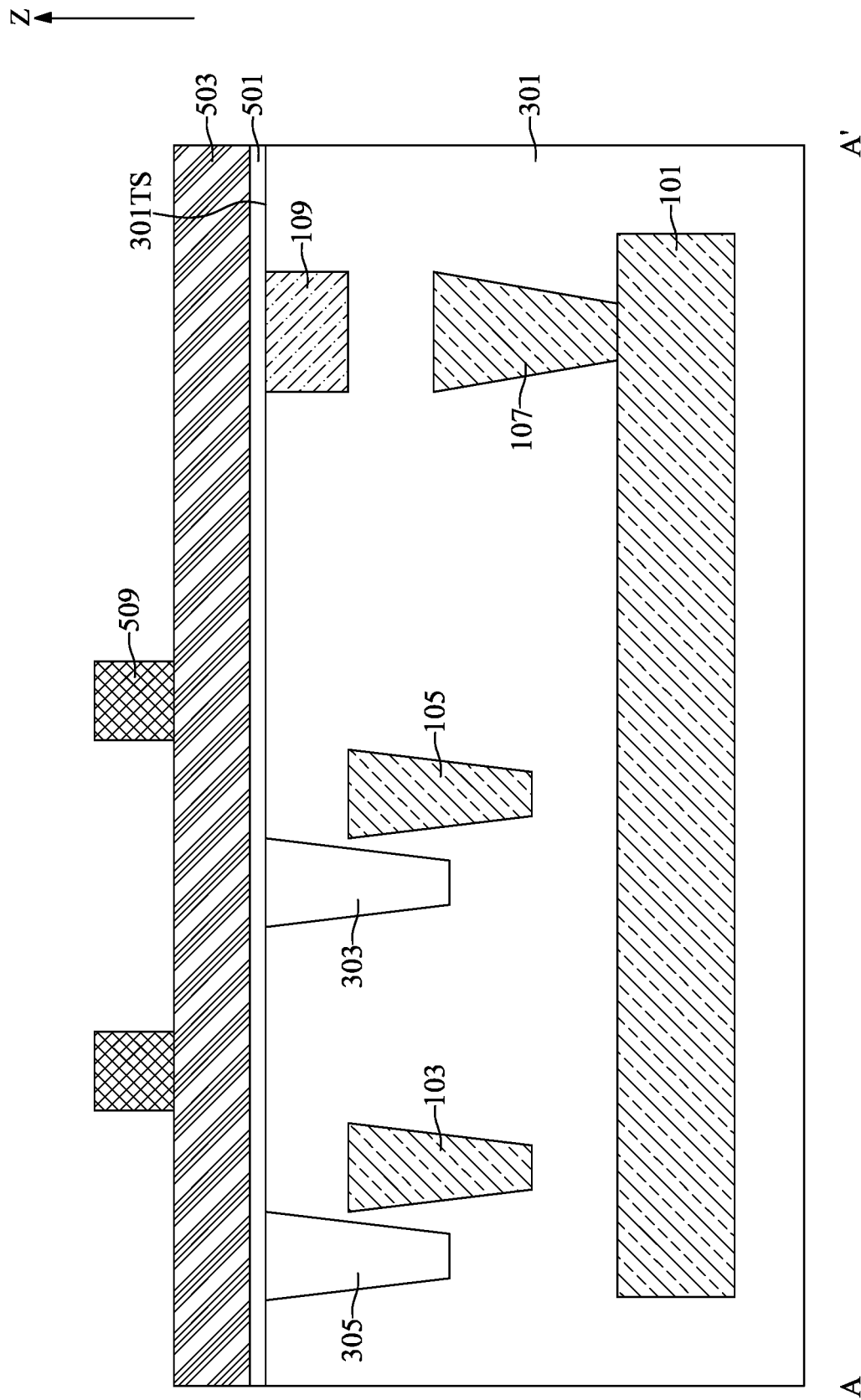

With reference to FIG. 11, a layer of first insulation material 501 may be blanket formed on the substrate 301. The layer of first insulation material 501 may be formed by, for example, chemical vapor deposition, atomic layer deposition, the like, or other applicable deposition process. The first insulation material 501 may be, for example, silicon oxide, silicon nitride, silicon oxynitride, or high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

With reference to FIG. 11, a layer of first conductive material 503 may be formed on the layer of first insulation material 501. The layer of first conductive material 503 may be formed by, for example, chemical vapor deposition, physical vapor deposition, sputtering, the like, or other applicable deposition process. The first conductive material 503 may be, for example, polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 11, a first mask layer 509 may be formed on the layer of first conductive material 503. The first mask layer 509 may have the pattern of the first gate structure 210 and the second gate structure 220. In some embodiments, the first mask layer 509 may be a photoresist layer. In some embodiments, the first mask layer 509 may be a hard mask layer formed of silicon oxide, silicon nitride, silicon oxynitride, silicon nitride oxide, or other applicable materials.

Figure 12:
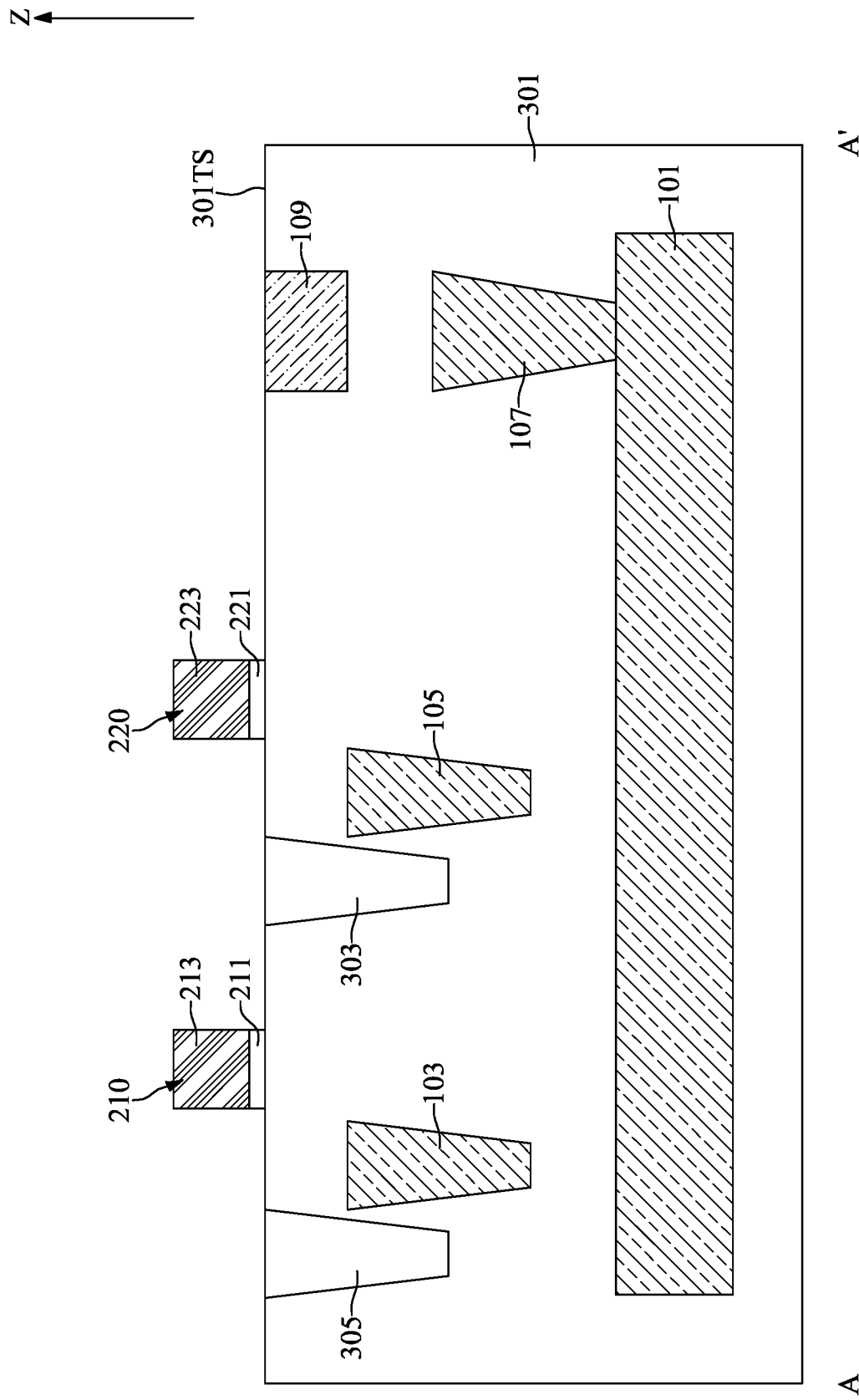

With reference to FIG. 12, an etch process, such as an anisotropic dry etch process, may be performed to remove portions of the first insulation material 501 and the first conductive material 503. After the etch process, the remaining first insulation material 501 may be turned into a first gate dielectric layer 211 and a second gate dielectric layer 221. The remaining first conductive material 503 may be turned into a first gate conductive layer 213 and a second gate conductive layer 223.

The first gate dielectric layer 211 may be formed on the substrate 301, between the plurality of insulation layers 303, 305, and may be not topographically aligned with the first extended conductive region 103. In other words, the first gate dielectric layer 211 may not be directly above the first extended conductive region 103 in a cross-sectional perspective. The first gate conductive layer 213 may be formed on the first gate dielectric layer 211. The first gate dielectric layer 211 and the first gate conductive layer 213 together configure the first gate structure 210.

The second gate dielectric layer 221 may be formed on the substrate 301 and between the insulation layer 303 and the baseline conductive region 109. The second gate dielectric layer 221 may be not topographically aligned with the second extended conductive region 105. In other words, the second gate dielectric layer 221 may not be directly above the second extended conductive region 105 in a cross-sectional perspective. The second gate conductive layer 223 may be formed on the second gate dielectric layer 221. The second gate dielectric layer 221 and the second gate conductive layer 223 together configure the second gate structure 220.

The first gate structure 210 and the second gate structure 220 may be integrated with programmable units such as e-fuses or anti-fuses so as to control the access of programming current to the programmable units.

Figure 13:
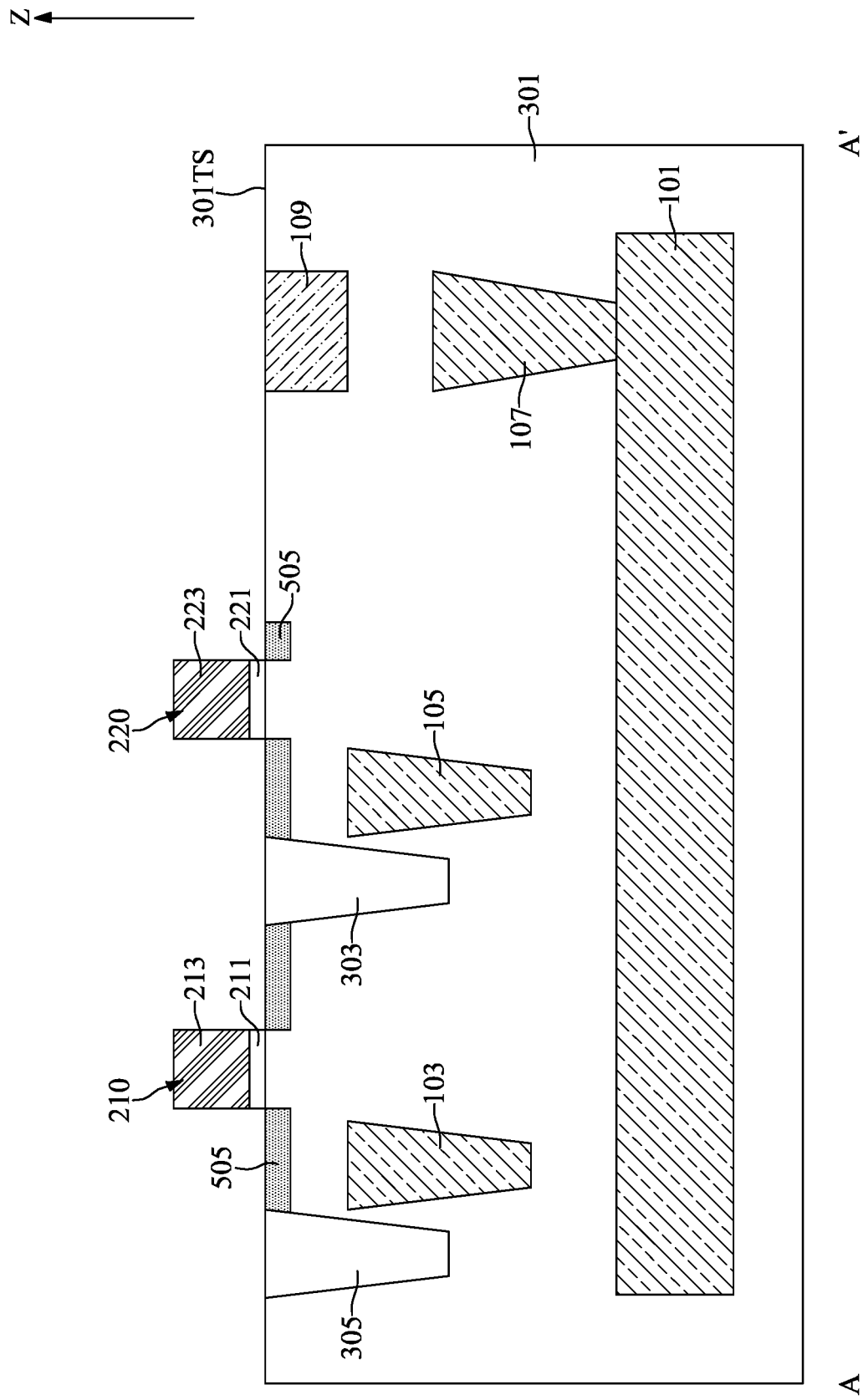

With reference to FIG. 13, an impurity implant process using the first gate structure 210 and the second gate structure 220 as pattern guides may be performed to form the plurality of lightly doped layers 505. The impurity implant process may be, for example, an n-type impurity implant process using n-type dopants (or impurities). The n-type dopants may be added to an intrinsic semiconductor to contribute free electrons to the intrinsic semiconductor. In a silicon-containing substrate, examples of n-type dopants include but are not limited to such as antimony, arsenic, and phosphorus. The plurality of lightly doped layers 505 may have a second electrical type which is different from the first electrical type. For example, the plurality of lightly doped layers 505 may be n-type.

In some embodiments, the region on the baseline conductive region 109 may be covered by a mask layer (not shown for clarity) during the impurity implant process.

Figure 14:
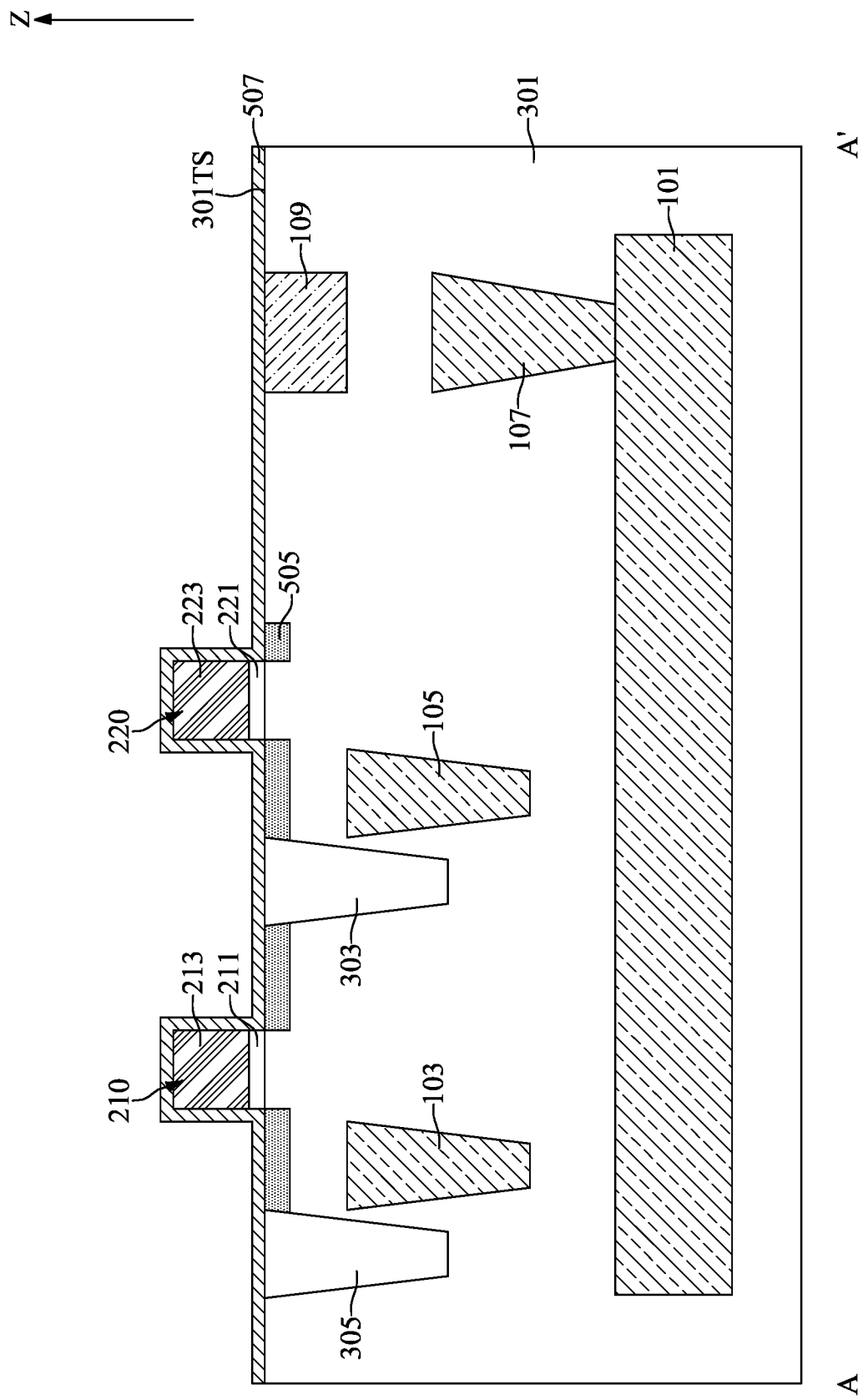

With reference to FIG. 14, a layer of spacer material 507 may be conformally formed to cover the substrate 301, the first gate structure 210, and the second gate structure 220. In some embodiments, the spacer material 507 may be, for example, a material having etch selectivity to the substrate 301 or a material having etch selectivity to the substrate 301 and the first gate conductive layer 213. In some embodiments, the spacer material 507 may be, for example, low temperature silicon. In some embodiments, the spacer material 507 may be silicon oxide, silicon nitride, silicon oxynitride, silicon nitride oxide, the like, or a combination thereof.

Figure 15:
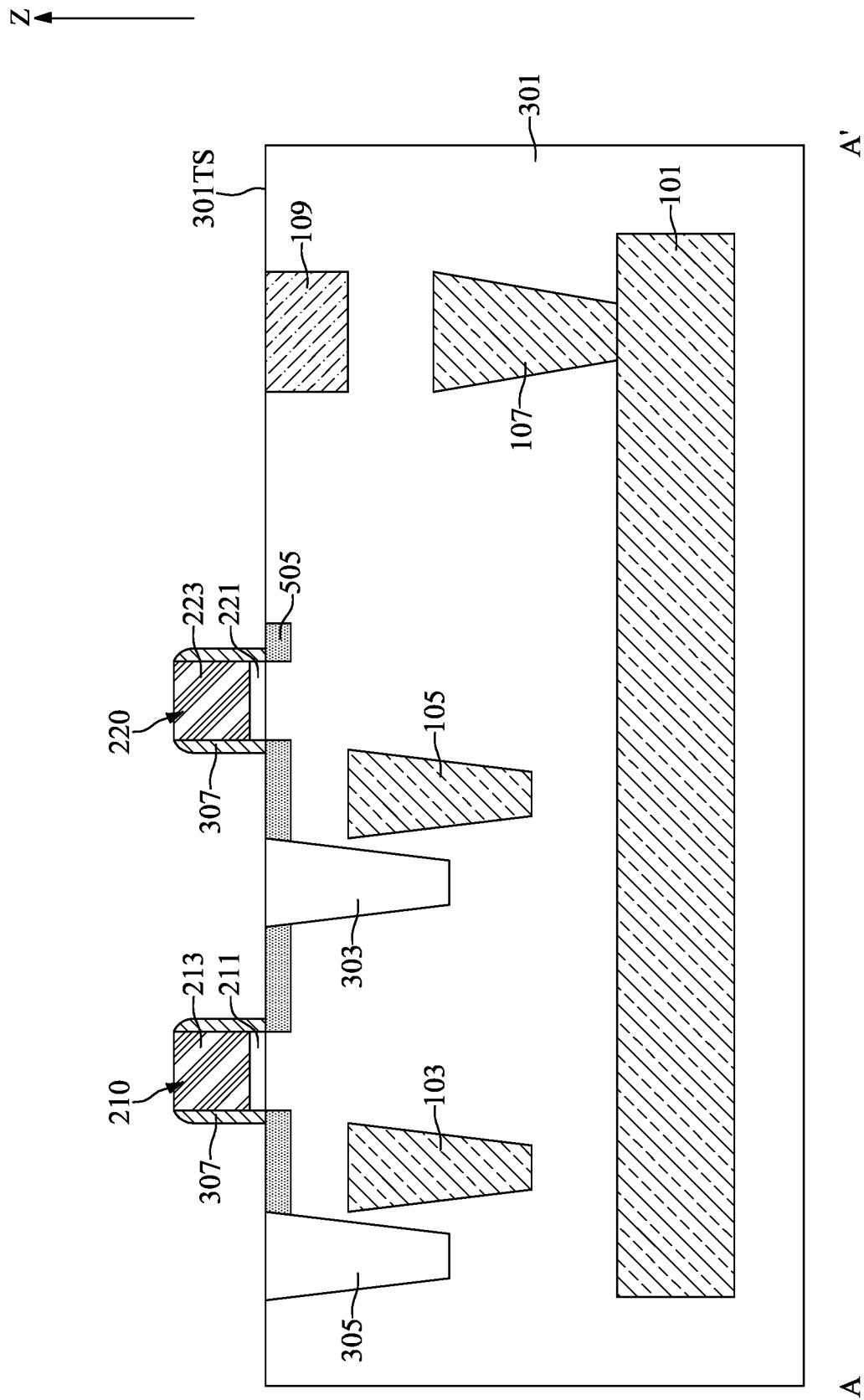

With reference to FIG. 15, a spacer etch process may be performed to remove portions of the layer of spacer material 507 formed on the top surface 301TS of the substrate 301, the first gate structure 210, and the second gate structure 220. The spacer etch process may be an anisotropic etch process. The etch rate ratio of the layer of spacer material 507 to the substrate 301 or the first gate conductive layer 213 may be between about 100:1 and about 1.05:1, between about 15:1 and about 2:1, or between about 10:1 and about 2:1 during the spacer etch process. After the spacer etch process, the remaining spacer material 507 may be regarded as the plurality of spacers 503.

Figure 16:
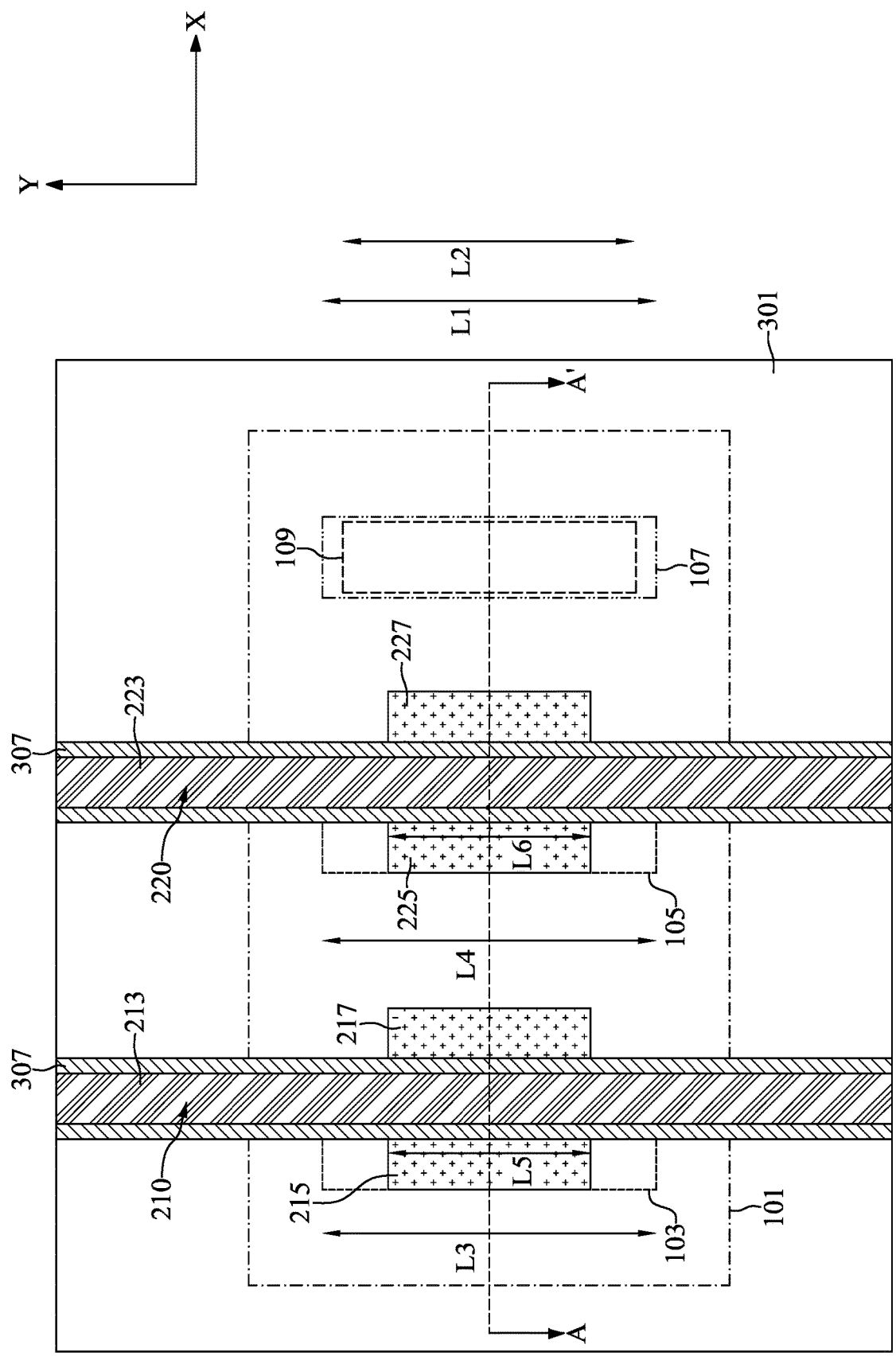
FIG. 16 illustrates, in a schematic top-view diagram, an intermediate semiconductor device in accordance with one embodiment of the present disclosure.
Figure 17:
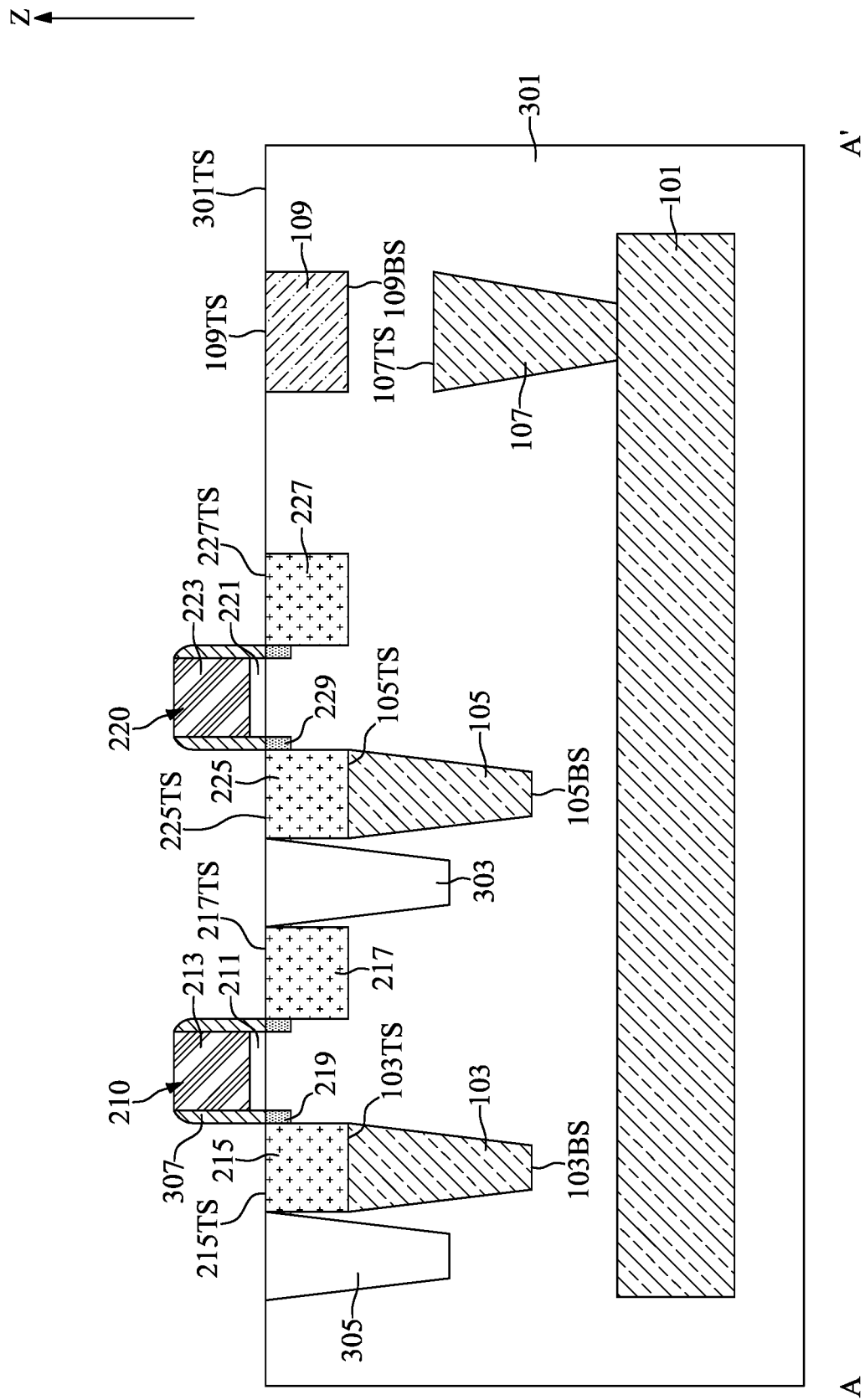
FIG. 17 is a schematic cross-sectional view diagram taken along a line A-A' in FIG. 16.

FIG. 16 illustrates, in a schematic top-view diagram, an intermediate semiconductor device in accordance with one embodiment of the present disclosure. FIG. 17 is a schematic cross-sectional view diagram taken along a line A-A' in FIG. 16.

With reference to FIGS. 1, 16, and 17, at step S21, first source/drain regions 215, 217 and second source/drain regions 225, 227 may be formed in the substrate 301.

With reference to FIGS. 16 and 17, an impurity implant process using the first gate structure 210, the second gate structure 220, and the plurality of gate spacers 307 as pattern guides may be performed to form the first source/drain regions 215, 217 and the second source/drain regions 225, 227. The impurity implant process may be, for example, an n-type impurity implant process using n-type dopants such as antimony, arsenic, and phosphorus. After the formation of the first source/drain regions 215, 217 and the second source/drain regions 225, 227, the plurality of lightly doped layers 505 may be turned into a plurality of first lightly doped regions 219 and a plurality of second lightly doped regions 229 directly under the plurality of gate spacers 307 and respectively adjacent to the first source/drain regions 215, 217 and the second source/drain regions 225, 227.

The first source/drain regions 215, 217 and the second source/drain regions 225, 227 may have the second electrical type the same as the plurality of first lightly doped regions 219 and the plurality of second lightly doped regions 229. The dopant concentration of the first source/drain regions 215, 217 and the second source/drain regions 225, 227 may be greater than the dopant concentration of the plurality of first lightly doped regions 219 and the dopant concentration of the plurality of second lightly doped regions 229. In some embodiments, the dopant concentration of the first source/drain regions 215, 217 and the second source/drain regions 225, 227 may be between about 1E17 atoms/cm^3 and between about 1E18 atoms/cm^3.

In some embodiments, the first source/drain regions 215, 217 and the second source/drain regions 225, 227, the plurality of first lightly doped regions 219, and the plurality of second lightly doped regions 229 may be doped with the same dopant. In some embodiments, the first source/drain regions 215, 217 and the second source/drain regions 225, 227, the plurality of first lightly doped regions 219, and the plurality of second lightly doped regions 229 may be doped with different dopants.

In some embodiments, an anneal process may be performed to activate the first source/drain regions 215, 217 and the second source/drain regions 225, 227. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

The first source/drain regions 215, 217 may be formed in the substrate 301 and adjacent to the sidewalls of the first gate structure 210, respectively and correspondingly. In some embodiments, the first drain region 215 may be formed in the substrate 301, adjacent to the insulation layer 305, adjacent to the spacer 307 on the first gate structure 210, and on the first extended conductive region 103. The top surface 215TS of the first drain region 215 may be substantially coplanar with the top surface 301TS of the substrate 301. The bottom surface of the first drain region 215 may directly contact the top surface 103TS of the first extended conductive region 103. That is, the bottom surface of the first drain region 215 and the top surface 103TS of the first extended conductive region 103 may be substantially coplanar. The first source region 217 may be formed in the substrate 301, adjacent to the insulation layer 303, and adjacent to the spacer 307 on the first gate structure 210. The top surface 217TS of the first source region 217 may be substantially coplanar with the top surface 301TS of the substrate 301.

In some embodiments, the bottom surfaces of the first source/drain regions 215, 217 and the bottom surface 109BS of the baseline conductive region 109 may be substantially coplanar. In some embodiments, the bottom surfaces of the first source/drain regions 215, 217 may be at a vertical level higher than the vertical level of the bottom surface 109BS of the baseline conductive region 109. In some embodiments, the bottom surfaces of the first source/drain regions 215, 217 may be at a vertical level lower than the vertical level of the bottom surface 109BS of the baseline conductive region 109. In some embodiments, the bottom surfaces of the first source/drain regions 215, 217 may be at a vertical level higher than the vertical level of the top surface 107TS of the edge conductive region 107.

The second source/drain regions 225, 227 may be formed in the substrate 301 and adjacent to the sidewalls of the second gate structure 220, respectively and correspondingly. In some embodiments, the second drain region 225 may be formed in the substrate 301, adjacent to the insulation layer 303, adjacent to the spacer 307 on the second gate structure 220, and on the second extended conductive region 105. The top surface 225TS of the second drain region 225 may be substantially coplanar with the top surface 301TS of the substrate 301. The bottom surface of the second drain region 225 may directly contact the top surface 105TS of the second extended conductive region 105. That is, the bottom surface of the second drain region 225 and the top surface 105TS of the second extended conductive region 105 may be substantially coplanar. The second source region 227 may be formed in the substrate 301, adjacent to the spacer 307 on the second gate structure 220, and between the baseline conductive region 109 and the second drain region 225. The top surface 227TS of the second source region 227 may be substantially coplanar with the top surface 301TS of the substrate 301.

In some embodiments, the bottom surfaces of the second source/drain regions 225, 227 and the bottom surface 109BS of the baseline conductive region 109 may be substantially coplanar. In some embodiments, the bottom surfaces of the second source/drain regions 225, 227 may be at a vertical level higher than the vertical level of the bottom surface 109BS of the baseline conductive region 109. In some embodiments, the bottom surfaces of the second source/drain regions 225, 227 may be at a vertical level lower than the vertical level of the bottom surface 109BS of the baseline conductive region 109. In some embodiments, the bottom surfaces of the second source/drain regions 225, 227 may be at a vertical level higher than the vertical level of the top surface 107TS of the edge conductive region 107.

In some embodiments, in a top-view perspective, the area of the first drain region 215 may be less than the area of the first extended conductive region 103. In some embodiments, the length L5 of the first drain region 215 may be less than the length L3 of the first extended conductive region 103. In some embodiments, the area of the second drain region 225 may be less than the area of the second extended conductive region 105. In some embodiments, the length L6 of the second drain region 225 may be less than the length L4 of the second extended conductive region 105.

The first drain region 215 and the second drain region 225 may be configured to electrically couple to a common external voltage source which provides voltages between about 0.0 volts and +6.0 volts. The common external voltage source may provide the voltage for programming programmable units integrated with the first gate structure 210 and the second gate structure 220. The first source region 217 and the second source region 227 may be configured to electrically couple to a common ground.

The semiconductor device 1A may include programmable units (not shown for clarity) integrated with the first gate structure 210 and the second gate structure 220. The programming voltage may be provided by the external common voltage source and the common ground through the first source/drain regions 215, 217 and the second source/drain regions 225, 227, respectively and correspondingly. The first gate structure 210 and the second gate structure 220 may be separately electrically coupled to different voltage sources so as to individually control the access of the programming currents between the first source/drain regions 215, 217 or the second source/drain regions 225, 227.

When only programming a programmable unit integrated with the first gate structure 210, a high voltage (e.g., +6.0 volts) may be concurrently applied to the first drain region 215. The high voltage may induce the leakage current from the first drain region 215. With the presence of the first extended conductive region 103, the leakage current from the first drain region 215 may be conducted to the first extended conductive region 103 and may be further conducted to the bottom conductive region 101. That is, the first extended conductive region 103 may serve as a current path to guide the leakage current for preventing adjacent elements (e.g., the second gate structure 220 which is not the target of programming operation) from damage by the leakage current. Accordingly, the second extended conductive region 105 may serve as a current path to guide the leakage current for preventing adjacent elements from damage by the leakage current.

In addition, the leakage current may originate from the voltage applied to the baseline conductive region 109. The edge conductive region 107 may serve as a current path to guide the leakage current from the baseline conductive region 109 for preventing adjacent elements from damage by the leakage current.

In contrast, without the presence of the first extended conductive region 103, the second extended conductive region 105, and the bottom conductive region 101, the leakage current induced by the high voltage may stray from the first drain region 215 or the second drain region 225 to damage adjacent elements such as adjacent gate structure. The threshold voltage of the damaged gate structure may be reduced. Hence, the performance of the damaged gate structure during current programming operation or future operations may be seriously affected.

One aspect of the present disclosure provides a semiconductor device including a substrate; a bottom conductive region positioned in the substrate; a first gate structure positioned on the substrate; a first drain region positioned in the substrate and adjacent to one sidewall of the first gate structure; and a first extended conductive region positioned in the substrate, under the first drain region, contacting a bottom surface of the first drain region, and distant from the bottom conductive region. A top surface of the first drain region and a top surface of the substrate are substantially coplanar. The bottom conductive region and the first extended conductive region include the same electrical type. The first drain region and the first extended conductive region include different electrical types.

Another aspect of the present disclosure provides a method for fabricating a semiconductor device including providing a substrate; forming a bottom conductive region in the substrate; forming a first extended conductive region in the substrate and above the bottom conductive region; forming a first gate structure on the substrate; and forming a first drain region in the substrate, proximity to one sidewall of the first gate structure, and on the first extended conductive region. A top surface of the first drain region and a top surface of the substrate are substantially coplanar. The bottom conductive region and the first extended conductive region include the same electrical type. The first drain region and the first extended conductive region include different electrical types.

Due to the design of the semiconductor device of the present disclosure, the bottom conductive region 101, the first extended conductive region 103, the second extended conductive region 105, and the edge conductive region 107 may serve as guide paths for the leakage currents induced by the high voltage during the programming operation. Therefore, the performance and reliability of the semiconductor device 1A may be improved.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a bottom conductive region positioned in the substrate;
   a first gate structure positioned on the substrate;
   a first drain region positioned in the substrate and adjacent to one sidewall of the first gate structure; and
   a first extended conductive region positioned in and surrounded by the substrate, under the first drain region, contacting a bottom surface of the first drain region, and distant from the bottom conductive region;
   wherein a top surface of the first drain region and a top surface of the substrate are substantially coplanar;
   wherein the substrate, the bottom conductive region and the first extended conductive region comprise the same electrical type;
   wherein the first drain region and the first extended conductive region comprise different electrical types.

2. The semiconductor device of claim 1, further comprising a first source region positioned adjacent to another sidewall of the first gate structure;
   wherein a top surface of the first source region and the top surface of the substrate are substantially coplanar.

3. The semiconductor device of claim 2, further comprising a baseline conductive region positioned in the substrate;

wherein a top surface of the baseline conductive region and the top surface of the substrate are substantially coplanar;

wherein the baseline conductive region and the bottom conductive region comprise the same electrical type.

4. The semiconductor device of claim 3, further comprising an edge conductive region positioned in the substrate, on the bottom conductive region, under the baseline conductive region, and distant from the baseline conductive region;

wherein the bottom conductive region and the edge conductive region comprise the same electrical type.

5. The semiconductor device of claim 4, further comprising a plurality of gate spacers positioned on the sidewalls of the first gate structure and on the substrate;

wherein the plurality of gate spacers comprise silicon oxide, silicon nitride, silicon oxynitride, or silicon oxide nitride.

6. The semiconductor device of claim 5, further comprising a plurality of first lightly doped regions positioned in the substrate, respectively and correspondingly adjoining the first drain region and the first source region, and respectively and correspondingly under the plurality of gate spacers.

7. The semiconductor device of claim 6, wherein the first gate structure comprises a first gate dielectric layer positioned on the substrate and a first gate conductive layer positioned on the first gate dielectric layer.

8. The semiconductor device of claim 7, wherein a bottom surface of the first extended conductive region is at a vertical level lower than a vertical level of a top surface of the edge conductive region.

9. The semiconductor device of claim 8, wherein a bottom surface of the baseline conductive region and the bottom surface of the first drain region are substantially coplanar.

10. The semiconductor device of claim 8, wherein a bottom surface of the baseline conductive region is at a vertical level lower than a vertical level of the bottom surface of the first drain region.

11. The semiconductor device of claim 8, wherein a length of the first extended conductive region is greater than or equal to a length of first drain region in a top-view perspective.

12. The semiconductor device of claim 11, wherein a length of the edge conductive region is greater than or equal to a length of the baseline conductive region.

13. The semiconductor device of claim 12, wherein the substrate and the bottom conductive region comprise the same electrical type.

14. The semiconductor device of claim 13, wherein the first drain region is configured to electrically couple to an external voltage source between about +0.0 volts and about +6.0 volts.

15. The semiconductor device of claim 13, wherein the baseline conductive region is configured to electrically couple to an external voltage source between about +0.0 volts and about −2.0 volts.

16. The semiconductor device of claim 13, further comprising a second gate structure, a second drain region, and a second extended conductive region;

wherein the second gate structure is positioned on the substrate, between the first gate structure and the baseline conductive region;

wherein the second drain region is positioned in the substrate, proximity to one sidewall of the second gate structure, and between the first source region and the baseline conductive region;

wherein the second extended conductive region is positioned in and surrounded by the substrate, under the second drain region, contacting a bottom surface of the second drain region, and distant from the bottom conductive region;

wherein a top surface of the second drain region and a top surface of the substrate are substantially coplanar;

wherein the substrate, the bottom conductive region and the second extended conductive region comprise the same electrical type;

wherein the second drain region and the second extended conductive region comprise different electrical types.

17. The semiconductor device of claim 16, further comprising an insulation layer positioned in the substrate and between the second drain region and the first source region;

wherein the insulation layer comprises silicon oxide, silicon nitride, silicon nitride, silicon oxynitride, or silicon oxide nitride.

18. The semiconductor device of claim 17, wherein a bottom surface of the insulation layer is at a vertical level higher than the vertical level of the bottom surface of the first extended conductive region.

19. A method for fabricating a semiconductor device, comprising:

providing a substrate;

forming a bottom conductive region in the substrate;

forming a first extended conductive region surrounded by the substrate and above the bottom conductive region;

forming a first gate structure on the substrate; and forming a first drain region in the substrate, proximity to one sidewall of the first gate structure, and on the first extended conductive region;

wherein a top surface of the first drain region and a top surface of the substrate are substantially coplanar;

wherein the substrate, the bottom conductive region and the first extended conductive region comprise the same electrical type;

wherein the first drain region and the first extended conductive region comprise different electrical types.

20. The method for fabricating the semiconductor device of claim 19, further comprising forming an edge conductive region in the substrate, on the bottom conductive region, and distal from the first extended conductive region.

* * * * *